United States Patent [19]
Chandross et al.

[11] Patent Number: 5,750,312
[45] Date of Patent: May 12, 1998

[54] PROCESS FOR FABRICATING A DEVICE

[75] Inventors: Edwin Arthur Chandross, Berkeley Heights; Omkaram Nalamasu, Basking Ridge; Elsa Reichmanis, Westfield; Gary Newton Taylor, Bridgewater; Larry Flack Thompson, Millington, all of N.J.

[73] Assignee: Lucent Technologies Inc., Murray Hill, N.J.

[21] Appl. No.: 236,706

[22] Filed: May 2, 1994

Related U.S. Application Data

[63] Continuation of Ser. No. 121,976, Sep. 15, 1993, abandoned, which is a continuation of Ser. No. 823,083, Jan. 15, 1992, abandoned, which is a continuation of Ser. No. 575,047, Aug. 30, 1990, abandoned.

[51] Int. Cl.$^6$ .................................. G03C 5/00; G03F 7/00
[52] U.S. Cl. ..................... 430/273.1; 430/311; 430/296; 430/961
[58] Field of Search ..................................... 430/271, 273, 430/311, 320, 296, 192, 193, 961, 271.1, 273.3

[56] References Cited

U.S. PATENT DOCUMENTS

| | | | |
|---|---|---|---|
| 3,895,949 | 7/1975 | Akamatsu et al. | 430/273 |
| 4,626,484 | 12/1986 | Nishioka et al. | 430/273 |
| 4,678,737 | 7/1987 | Schneller et al. | 430/273 |
| 5,240,812 | 8/1993 | Conley | 430/273 |

FOREIGN PATENT DOCUMENTS

| | | |
|---|---|---|
| 564389 | 10/1993 | European Pat. Off. . |

OTHER PUBLICATIONS

Kosar *Light Sensitive Systems* Wiley & Sons, Inc. 1965, pp. 339, 342.
Japanses Patent Application No. 63–287950 (European Counterpart Application No. 0,290.916A2, published Nov. 17, 1988). Translation: yes.
Japanese Patent Application No. 59–45493, published Mar. 14, 1984. Translation: yes.
Japanese Patent Application No. 50–152803, published Dec. 9, 1975. Translation: yes.
Japanese Patent Application No. 62–223747, published Oct. 1, 1987. Translation: yes.
Japanese Patent Application No. 62–79441, published Apr. 11, 1987. Translation: yes.
Japanese Patent Application No. H03–507106 (PCT Counterpart No. 92/05474, published Apr. 2, 1992).
*Semiconductor Lithography*, W. M. Moreau, Plenum Press, N.Y., 1988, Chapter 6.
*Microelectronic Engineering 1*, C. G. Willson, et al., 269 (1983).
*Journal of the Electrochemical Society*, 133, 181 (1986) Willson et al.

*Primary Examiner*—Kathleen Duda
*Attorney, Agent, or Firm*—Bruce S. Schneider

[57] ABSTRACT

It has been found that surface reactions with basic materials such as amines found in the processing environment during lithographic processing contribute to a loss of linewidth control for resists such as chemically amplified resists. This loss in linewidth results from the reaction of the acid generated by exposing radiation with, for example, the amine resulting in a lack of chemical reaction where such reaction is desired. The problem is solved in one embodiment by employing an acid containing barrier layer on the resist.

19 Claims, No Drawings

PROCESS FOR FABRICATING A DEVICE

This application is a continuation application Ser. No. 08/121976, filed on Sep. 15, 1993, now abandoned, which is a continuation application Ser. No. 07/823,083, filed on Jan. 15, 1992 (now abandoned) which is a continuation of Ser. No. 07/575,047, filed on Aug. 30, 1990 (now abandoned).

BACKGROUND OF THE INVENTION

1. Field of the Invention

This invention relates to device processing and in particular device processing involving lithographic procedures.

2. Art Background

In the manufacture of devices such as integrated circuits and integrated optical devices, regions of the substrate being processed are defined in a pattern utilizing lithographic techniques. (The substrate being processed includes, depending on the particular device being fabricated, semiconductor material, dielectric material, and/or metals.) The desired pattern delineation is usually achieved by first forming a relatively thin layer, e.g. 0.5 to 2 µm in thickness, of a resist material on the substrate. Various ways have been derived to produce this relatively thin layer, but generally a solution of the material is placed on the substrate and the substrate is spun to distribute the material uniformly over the substrate and remove most of the solvent. (See W. M. Moreau, *Semiconductor Lithography*, Plenum Press, N.Y., 1988, chapter 6, for a description of spin coating.)

After coating (and possibly other processing such as baking) the resist is exposed to actinic radiation in a desired pattern. Various modes of exposure are possible. One typical method involves directing electromagnetic radiation (e.g. deep ultraviolet, ultraviolet or x-radiation) through a mask which attenuates incident electromagnetic radiation in the desired pattern. That is, light is made incident on a major surface of the mask and exits in the desired pattern on the far side of the mask. This emanating light is then directed to the substrate. An alternative method employs particle radiation such as electrons or ions, generally in the form of a beam, that is directed onto the resist in selected regions. Typically, this pattern selection is produced by a variety of schemes including raster scanning of a particle beam, e.g. ion or electron beam.

After exposure in a pattern, the resist is developed typically by subjecting it to a solvent or plasma which differentially removes either the exposed or unexposed region. (The exposed region is removed in the case of a positive resist and the unexposed region is removed in the case of a negative resist.) The resulting pattern formed on the substrate is then used to delineate device regions through processes such as plasma or wet etching portions of the substrate not covered by the resist or metallization of the substrate in such uncovered regions.

A large number of resist schemes based on various radiation-induced chemical reactions have been proposed. One class of such proposed resist materials includes 1) a resin that undergoes a chemical reaction when subjected to acid combined with 2) a material that liberates acid upon exposure to actinic radiation. Thus in regions exposed to radiation, acid is formed from the acid generator, and this acid interacts with the resin to produce a material that is differentially soluble relative to the unexposed regions. Depending on the choice of resin, acid, and additives these resists perform to give either positive or negative tone patterns. Since for one class of resists one molecule of generated acid often induces, on average, reaction of substantially more than one reactive group in the resin and/or additive, such resists are termed chemically amplified resists.

Chemically amplified resists have been proposed for exposure with deep UV radiation and also for electron exposure such as discussed by C. G. Willson, et al., *Microelectronic Engineering*, 1, 269 (1983) and *Journal of the Electrochemical Society*, 133, 181 (1986). Typically, contemplated uses for such material have concentrated on the formation of patterns having strict design rules, i.e., design rules smaller than 1 µm where exposures to deep ultraviolet, x-ray or particle beams are advantageously performed. Thus, significant efforts in such systems have centered on producing such fine-line patterns.

SUMMARY OF THE INVENTION

It has been found that resist materials relying on the formation of an acid are disadvantageously affected by the presence of basic materials such as amines in typical processing environments. For example, hexamethyldisilazane is extensively used to promote adhesion between resists and substrates. Surprisingly, even in a clean room environment, sufficient amine is present in the air to substantially react with the acid generated by exposure of a resist such as a chemically amplified resist. Additionally bases are often present, for example, as impurities in processing materials and as such are present in the processing environment. As a result, resist performance is deleteriously affected (seen as surface residue in exposed regions and inadequate linewidth control) to an extent depending on the time the resist is subjected to the environment before chemical reaction is completed between generated acid and resin or additive such as a dissolution inhibitor. Accordingly, processing parameters such as the time between exposure and postexposure bake and the time between coating of a substrate and exposure become critical. Thus variations in resist performance are difficult to avoid.

These consequences produced through the previously unappreciated problems induced by the presence of basic materials in the environment are avoided by substantially reducing the interaction of such bases with the resist material. In one embodiment a barrier material is formed on the resist. This barrier material is chosen to contain acid moieties reactive with the bases. For example, a copolymer of methacrylic acid and benzyl methacrylate is coated onto the resist. Such a barrier layer substantially reacts with basic moieties preventing them from reaching the resist material. As a result, the control of processing parameters is much less critical and good linewidth uniformity, i.e. uniformity better than 0.05 µm for 0.5 µm features, is obtained.

DETAILED DESCRIPTION

As discussed, bases, i.e. Lewis bases such as ammonia, aliphatic amines and aromatic amines, in the processing environment even at the parts-per-billion level have been found to cause nonuniformities in patterned lines formed through the exposure of resist materials relying on the generation of an acid moiety. It is contemplated that such low levels of basic species produce this effect because the amount of acid required to induce chemical change in the resist is small. Thus the invention relies on this realization and requires that an expedient be employed to substantially prevent such interaction, i.e. reduce the interaction between basic moieties and the resist such that the dissolution rate of the topmost 1000 Å of resist is not less than 25% of the dissolution rate of the remaining resist material.

In one embodiment a barrier material is interposed between the base and the resist material. The composition of this barrier material is chosen so that it includes acidic species that react with the basic moieties. (Generally polymers alone are not effective diffusion barriers to such basic moieties.) Exemplary of suitable acid materials include film-forming polymers having acid moieties, such as copolymers of 1) either methacrylic acid, acrylic acid or vinylphenylacetic acid with 2) either methacrylates, acrylates or styrenes, e.g. the copolymers of butyl methacrylate and methacrylic acid or copolymers of methacrylic acid and benzyl methacrylate. Alternatively film-forming resin materials such as a poly(vinyl-phenol) resin with a dissolved acid, such as citric acid or tartaric acid, that is unaffected by processing also yield the desired reactive barrier.

The amount of the acid necessary to prevent undesirable pattern nonuniformities depends on the concentration of base in the environment and the time of exposure to this environment. However, typically the minimum amount of acid employable for copolymers containing acid moieties chemically bound to the polymer is that which allows solubility of the barrier layer in the resist development solvent a rate at least equal to, and preferably at least twice, the dissolution rate of the material removed in the exposed resist by this developer. In the case of a barrier polymer containing an unbound, dissolved acid, the minimum amount of acid required is that necessary to effect the necessary reaction with the base while the host polymer should satisfy the previously described dissolution rate requirement. The maximum amount of acid generally acceptable is that which yields a barrier material having the appropriate dissolution rate and together with other groups affords a resin with a $T_g$ less than the $T_g$ of the resist material. Typically the greater the amount of acid present in the barrier material, the higher the $T_g$ of such a layer. High $T_g$'s typically produce poor adhesion between the resist and the underlying substrate. Generally acid concentrations and/or strengths in the barrier material should be sufficiently low to avoid inducing substantial reaction in the resist resulting from acid diffusion or interfacial reactions. Typically, concentrations greater than 10 mole percent for acids having a $pK_a$ in the range 3 to 6 are suitable.

As discussed, it is desirable that the barrier material have a $T_g$ lower than the $T_g$ of the resist. Generally the lower the $T_g$ of the barrier layer the less the stress induced in the underlying resist material and the better the adhesion of that underlying material to the substrate. However, a $T_g$ below 30° C. is generally not desirable because it tends to produce a film susceptible to particulate defects. Additionally the thickness of the barrier layer generally should be in the range 100 to 3000 Å. Materials thinner than 100 Å typically do not yield adequate protection against basic moieties while barrier layers thicker than 3000 Å tend to cause inferior adhesion between the resist and the substrate. The barrier layer material should have a weight average molecular weight in the range 1000 to 200,000 g/mol. Molecular weights less than 1000 g/mol generally yield poor film forming characteristics while molecular weights above 200,000 g/mol lead to poor dissolution behavior in typical solvents.

Intermixing between the barrier layer and the resist material should generally be avoided. This criterion is typically satisfied by spin coating the barrier layer material onto the resist using a barrier material solvent that leaves the underlying resist material essentially unaffected. Generally, polar solvents such as water, butanol, propanol or their mixtures for the previously described copolymer barrier layers and for materials such as those based on poly(vinyl phenol) have essentially no effect on the performance of resist materials based on resins such as poly(t-butoxycarbonyloxystyrene) or poly(t-butoxycarbonyloxystyrene sulfone).

The barrier material should not substantially increase the exposure dose required. Generally less than 10 percent of the incident radiation should be absorbed by the barrier material. Typically for the above-described barrier layer thicknesses, optical densities in the range 0 to 0.1 avoid undesirable attenuation of incident radiation. Additionally the refractive index of the barrier material should be within ±15% of the refractive index for the resist. For layers thicker than a few hundred Angstroms, greater differences in refractive index lead to excessive reflection and diffraction at the barrier layer/resist interface than is desirable.

By utilizing an expedient that prevents interaction of basic moieties with the resist material, linewidth uniformity is substantially enhanced and no surface scum is observed. For example, resolution of a pattern having design rules less than 0.5 μm is substantially degraded, e.g., bridging between features, if a resist coated substrate is not exposed within 1 hour of its formation and if not postexposure baked within 2 minutes after its exposure. In contrast, such design rules are easily maintained if a barrier layer is employed even if the coated resist is not exposed for 8 days and not postexposure baked until 30 minutes after exposure. Thus, linewidth control and pattern yield are substantially facilitated by avoiding interactions between basic moieties and resist materials relying on acid generation.

The following examples are illustrative of processing conditions involved in the invention.

EXAMPLE 1

Synthesis of poly(butyl methacrylate-co-methacrylic acid)

Approximately 57 grams of butyl methacrylate was dissolved in 200 mL of tetrahydrofuran. This solution was then filtered through 150 grams of basic alumina directly into a reaction flask. Approximately 35 grams of freshly distilled methacrylic acid was added in one aliquot to the reaction flask. The resulting composition was purged with argon and brought to reflux. Approximately 2 grams of azo-bis-isobutyronitrile was dissolved in 20 mL of tetrahydrofuran and the resulting solution was introduced with a syringe in one aliquot into the reaction flask. Reflux was continued for approximately 3 hours and the reaction was then quenched by immersing the reaction flask in a DRY ICE® /acetone bath. An additional 100 mL of tetrahydrofuran was added to the mixture and the reaction mixture was then brought to room temperature. The reaction mixture was added dropwise to 4 L of petroleum ether. The resulting precipitate was isolated by filtration, redissolved in 300 mL of tetrahydrofuran, and again precipitated in 4 L of petroleum ether with subsequent recovery by filtration. The recovered precipitate was dried in a vacuum oven at room temperature for 24 hours and then at 50° C. for 4 hours. This procedure afforded a copolymer having a composition that is approximately a 50:50 mole percent copolymer with a weight average molecular weight of approximately 25,000.

EXAMPLE 2

Synthesis of poly(benzyl methacrylate-co-methacrylic acid)

The procedure of Example 1 was followed except 70 grams of benzyl methacrylate was used instead of the 50 grams of butyl methacrylate. This procedure afforded a copolymer having a composition that is approximately a 50:50 mole percent copolymer with a weight average molecular weight of approximately 25,000.

EXAMPLE 3

A 1% solution by weight of the material formed in Example 1 was dissolved in a 1:1 mixture of 1-propanol and 1-butanol. A filter stack was formed having an uppermost filter stopping one micron particles, an intermediary filter stopping 0.5 µm particles, and a lowermost filter stopping 0.2 µm particles. The solution obtained was passed through this filter stack three times.

A 5" in diameter silicon wafer was coated with a chemically amplified resist. (This chemically amplified resist was based on poly(t-butoxycarbonyloxystyrene sulfone) and combined with an organic photosensitive acid generator of the substituted nitrobenzyl ester type. Such materials are fully described in Houlihan 2-14-24, Ser. No. 07/316,051, filed Feb. 24, 1989, which is hereby incorporated by reference.) This resist material was spin coated onto the silicon wafer to form an approximately 1 µm thick film. The substrate was prebaked on a vacuum hot plate for approximately one minute at 105° C. Approximately 5 mL of the previously prepared 1% solution of copolymer was placed on the surface of the coated resist. The wafer was spun at approximately 3,000 rpm for approximately 1 min and yielded approximately a 250 Å thick barrier layer film. The substrate was again baked on a vacuum hot plate at 105° C. for 1 min. The resulting coated substrate was exposed using a GCA LaserStep® exposure tool operating at 2,480 Å. The exposure pattern was a standard resolution testing pattern with series of features ranging in dimension from 0.3 µm to 10 µm. The dose employed was approximately 50 mJ per $cm^2$. A series of the above-described substrates were prepared and postexposure baked at 115° C. for 30 seconds on a vacuum hot plate at various times after exposure. The postbaked substrates were immersed in 0.17 N tetramethylammonium hydroxide for 30 seconds. The wafers were rinsed in deionized water for 30 seconds and subsequently spin dried.

Inspection of the resulting patterns using a scanning electron microscope indicated no deterioration of pattern quality for intervals between exposure and postexposure bake of up to 30 min.

EXAMPLE 4

The procedure of Example 3 was followed except instead of using the copolymer described in Example 1 the copolymer described in Example 2 was employed. Additionally this copolymer was spun on using a 180:50:25 by volume spinning solvent of 1-butanol, 1-propanol, and water. The results obtained were essentially the same as those described in Example 3.

EXAMPLE 5

The procedure of Example 4 was followed except after coating of the copolymer onto the resist material but before exposure of the resist, the substrate was allowed to sit in the ambient for 8 days. There was no observed change in results from that observed in Example 4.

EXAMPLE 6

The procedure of Example 4 was followed except instead of using the resist described in Example 3, the chemically amplified resist was based on poly(t-butoxycarbonyloxystyrene sulfone) combined with a photosensitive acid generator of the onium salt type. Additionally, the exposure dose employed was approximately 20 $mJ/cm^2$. The results obtained were essentially the same as those described in Example 3.

EXAMPLE 7

The procedure of Example 4 was followed except no barrier film copolymer was coated on the surface of the resist. Inspection of the resulting patterns using a scanning electron microscope indicated severe deterioration of pattern quality for intervals between exposure and postexposure bake of 1 to 2 min.

EXAMPLE 8

The procedure of Example 6 was followed except no barrier film copolymer was coated on the surface of the resist. The results obtained were essentially the same as those described in Example 7.

We claim:

1. A process for fabricating a device comprising the steps of forming a radiation sensitive resist layer on a substrate, exposing in a pattern said resist to said radiation, developing said patterned resist, and employing said developed resist in defining regions of said device characterized in that said exposure generates an acid in said resist which induces a further compositional change in said resist and an expedient is employed during said exposure to prevent substantial reaction of environmental basic moieties with said acid in said resist on said substrate.

2. The process of claim 1 wherein said expedient comprises a barrier layer overlying said resist.

3. The process of claim 2 wherein said barrier layer contains an acid moiety.

4. The process of claim 3 wherein said barrier layer comprises a copolymer of methacrylic acid and benzyl methacrylate.

5. The process of claim 2 wherein said device comprises an integrated circuit.

6. The process of claim 2 where said resist comprises a combination of a material that generates acid upon said exposure and an acid sensitive resin.

7. The process of claim 1 wherein said device comprises an integrated circuit.

8. The process of claim 1 wherein said radiation is chosen from the group consisting of ultraviolet light, x-ray-radiation, electrons and ions.

9. The process of claim 1 wherein said expedient comprises a barrier layer comprising a copolymer of a monomer chosen from the group consisting of acrylic acid, methacrylic acid, vinylphenylacetic acid with a monomer chosen from the group consisting of methacrylates, acrylates, and styrenes.

10. The process of claim 9 wherein said copolymer comprises a copolymer of butyl methacrylate and methacrylic acid.

11. The process of claim 1 wherein the source of said environmental basic moieties comprises processing reagents.

12. The process of claim 1 wherein the source of said environmental basic moieties comprises the atmosphere.

13. The method of protecting acid catalyzed resist compositions from contamination by vapors of organic or inorganic bases comprising the steps of:

(a) coating a substrate with a first layer of an acid catalyzed resist composition which is sensitive to ultraviolet light, e-beam, or x-ray radiation, and (b) overcoating the first layer of acid catalyzed resist composition with a thin film of a polymeric film forming composition to form a second layer which is sufficiently impermeable to vapors of organic and inorganic bases to prevent desensitization of the resist composition, wherein said second layer comprises a polymer having acidic moieties, and said second layer is soluble in aqueous alkaline developer.

14. The method of claim 13 wherein the polymeric film-forming composition is selected from polyacrylic acids and styrene-based polymers.

15. A protective topcoat disposed on a substrate comprising an ultraviolet-, e-beam-, or x-ray- radiation sensitive acid-catalyzed resist composition, the topcoat comprising a thin film of a polymeric film-forming composition which is sufficiently impermeable to vapors of organic and inorganic bases to prevent desensitization of the resist composition, wherein said topcoat comprises a polymer having acidic moieties, and said topcoat is soluble in aqueous alkaline developer.

16. The protective topcoat of claim 15 wherein the polymeric film-forming composition is selected from polyacrylic acids and polystyrenes.

17. A process for fabricating a device comprising the steps of forming a radiation-sensitive resist layer on a substrate, exposing in a pattern said resist to radiation, developing said patterned resist, and employing said developed resist in defining regions of said device characterized in that said exposure generates an acid in said resist which induces a further compositional change in said resist and an expedient is employed to prevent substantial reaction of environmental basic moieties with said resist on said substrate, wherein said expedient comprises placing a barrier layer overlying said resist, said barrier layer comprising a non-reactive film-forming material having means to prevent substantial reaction of environmental basic moieties with said resist.

18. A process for fabricating a device according to claim 17 wherein said means to prevent substantial reaction of environmental basic moieties with said resist comprises a dissolved acid.

19. A pattern forming method comprising the steps of:

forming, on a substrate, a radiation-sensitive layer comprising as a main component a radiation-sensitive composition containing a compound capable of generating an acid when exposed to a chemical radiation and a compound having at least one linkage decomposable by an acid;

forming an acidic coating layer on the radiation-sensitive layer;

pattern-exposing the radiation-sensitive layer and the acidic coating layer to a chemical radiation; and developing the radiation-sensitive layer and the acidic coating layer by removing exposed parts of the layers after the pattern exposing step.

* * * * *